(12) United States Patent
Toyama et al.

(10) Patent No.: US 6,995,699 B2
(45) Date of Patent: Feb. 7, 2006

(54) ENCODING METHOD, AND ENCODING APPARATUS, AND DECODING METHOD AND DECODING APPARATUS

(75) Inventors: Keisuke Toyama, Tokyo (JP); Minoru Tsuji, Chiba (JP); Shiro Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 373 days.

(21) Appl. No.: 10/432,924

(22) PCT Filed: Sep. 26, 2002

(86) PCT No.: PCT/JP02/09973

§ 371 (c)(1),
(2), (4) Date: May 28, 2003

(87) PCT Pub. No.: WO03/030374

PCT Pub. Date: Apr. 10, 2003

(65) Prior Publication Data

US 2004/0039568 A1 Feb. 26, 2004

(30) Foreign Application Priority Data

Sep. 28, 2001 (JP) .............................. 2001-303546

(51) Int. Cl.
*H03M 7/30* (2006.01)
(52) U.S. Cl. .................... 341/76; 341/77; 704/225; 704/229
(58) Field of Classification Search ............. 341/76–77
See application file for complete search history.

(56) References Cited

U.S. PATENT DOCUMENTS

| | | | | |
|---|---|---|---|---|
| 5,115,240 A | * | 5/1992 | Fujiwara et al. | 341/51 |
| 5,260,693 A | * | 11/1993 | Horsley | 341/67 |
| 5,268,685 A | * | 12/1993 | Fujiwara | 341/76 |
| 5,515,395 A | * | 5/1996 | Tsutsui | 375/242 |
| 5,583,967 A | * | 12/1996 | Akagiri | 704/200.1 |
| 5,608,713 A | * | 3/1997 | Akagiri et al. | 369/124.08 |
| 5,731,767 A | * | 3/1998 | Tsutsui et al. | 341/50 |
| 5,924,925 A | * | 7/1999 | Nystrom | 454/365 |

FOREIGN PATENT DOCUMENTS

| | | |
|---|---|---|
| JP | 03-263925 | 11/1991 |
| JP | 04-104617 | 4/1992 |
| JP | 08-046518 | 2/1996 |

* cited by examiner

*Primary Examiner*—Peguy JeanPierre
*Assistant Examiner*—Khai M. Nguyen
(74) *Attorney, Agent, or Firm*—Sonnenschein, Nath & Rosenthal LLP

(57) ABSTRACT

In an encoding apparatus, when difference value between adjacent quantization units of quantization accuracy information where, e.g., distribution range is 0~7, e.g., if difference value is 3 or more, 8 is subtracted, and if difference value is less than −4, 8 is added to thereby transform two difference values where difference therebetween is 8 into the same value. Thus, the distribution range of difference value becomes −4~3, and size of code book (table) can be held down to the same size in the case where difference is not taken. In addition, high order 1 bit of difference value may be masked to carry out replacement into value consisting of only low order 3 bits, thus also making it possible to prevent increase in size of code book (table).

34 Claims, 14 Drawing Sheets

| DIFFERENCE VALUE | CODE | NO. OF BITS |
|---|---|---|
| −7 | 11111111 | 8 |
| −6 | 11111101 | 8 |
| −5 | 1111101 | 7 |
| −4 | 111101 | 6 |
| −3 | 11101 | 5 |
| −2 | 1101 | 4 |
| −1 | 101 | 3 |
| 0 | 0 | 1 |
| 1 | 100 | 3 |
| 2 | 1100 | 4 |
| 3 | 11100 | 5 |
| 4 | 111100 | 6 |
| 5 | 1111100 | 7 |
| 6 | 11111100 | 8 |
| 7 | 11111110 | 8 |

FIG.3

(PRIOR ART)

| DIFFERENCE VALUE | CODE | NO. OF BITS |
|---|---|---|
| −14 | 11111111111 | 11 |
| −13 | 11111111110 | 11 |
| −12 | 11111111101 | 11 |
| −11 | 11111111100 | 11 |
| −10 | 11111111011 | 11 |
| −9 | 11111111010 | 11 |
| −8 | 11111111001 | 11 |
| −7 | 11111111000 | 11 |
| −6 | 11111101 | 8 |
| −5 | 1111101 | 7 |
| −4 | 111101 | 6 |
| −3 | 11101 | 5 |
| −2 | 1101 | 4 |
| −1 | 101 | 3 |
| 0 | 0 | 1 |
| 1 | 100 | 3 |
| 2 | 1100 | 4 |
| 3 | 11100 | 5 |
| 4 | 111100 | 6 |
| 5 | 1111100 | 7 |
| 6 | 11111100 | 8 |
| 7 | 11111110000 | 11 |
| 8 | 11111110001 | 11 |
| 9 | 11111110010 | 11 |
| 10 | 11111110011 | 11 |
| 11 | 11111110100 | 11 |
| 12 | 11111110101 | 11 |
| 13 | 11111110110 | 11 |
| 14 | 11111110111 | 11 |

FIG.4

(PRIOR ART)

| DIFFERENCE VALUE | CODE | NO. OF BITS |
|---|---|---|
| −4 | 1 1 1 1 1 | 5 |
| −3 | 1 1 1 1 0 | 5 |
| −2 | 1 1 0 1 | 4 |
| −1 | 1 0 1 | 3 |
| 0 | 0 | 1 |
| 1 | 1 0 0 | 3 |
| 2 | 1 1 0 0 | 4 |
| 3 | 1 1 1 0 | 4 |

|   | REFERENCE VALUE(A) |   | INFORMATION VALUE(B) |   | DIFFERENCE VALUE(C) |   | PROCESSED DIFFERENCE VALUE(C) |
|---|---|---|---|---|---|---|---|
| I.   | 0 | − | 7 | = | −7 | → | 1 |
| II.  | 7 | − | 2 | = | 5  | → | −3 |
| III. | 5 | − | 4 | = | 1  | → | 1 |

FIG.9

| QUANTIZATION UNIT NO. | 0 | 1 | 2 | 3 | 4 | 5 | 6 | 7 |  |
|---|---|---|---|---|---|---|---|---|---|
| INFORMATION VALUE | 7 | 7 | 7 | 6 | 6 | 7 | 2 | 1 |  |
| DIFFERENCE VALUE |  | 0 | 0 | 1 | 0 | −1 | 5 | 1 |  |
| NO. OF ENCODED BITS | 3 | 1 | 1 | 3 | 1 | 3 | 7 | 3 | 22bits |
| PROCESSED DIFFERENCE VALUE |  | 0 | 0 | 1 | 0 | −1 | −3 | 1 |  |
| NO. OF PROCESSED ENCODED BITS | 3 | 1 | 1 | 3 | 1 | 3 | 5 | 3 | 20bits |

FIG.10

| | REFERENCE VALUE(A) | | DECODED VALUE(C) | | INFORMATION VALUE(B) | | PRIMARY INFORMATION VALUE(B) |
|---|---|---|---|---|---|---|---|
| I. | 0 | − | 1 | = | −1 | → | 7 |
| II. | 7 | − | (−3) | = | 10 | → | 2 |
| III. | 5 | − | 1 | = | 4 | → | 4 |

| DIFFERENCE VALUE | CODE | NO. OF BITS |
|---|---|---|
| 0 | 0 | 1 |
| 1 | 1 0 0 | 3 |
| 2 | 1 1 0 0 | 4 |
| 3 | 1 1 1 0 | 4 |
| 4 | 1 1 1 1 1 | 5 |
| 5 | 1 1 1 1 0 | 5 |
| 6 | 1 1 0 1 | 4 |
| 7 | 1 0 1 | 3 |

ENCODING METHOD, AND ENCODING APPARATUS, AND DECODING METHOD AND DECODING APPARATUS

BACKGROUND OF THE INVENTION

The present invention relates to an encoding method and an encoding apparatus, a decoding method and a decoding apparatus, a transmission apparatus and a transmission method and a transmission apparatus, and a recording medium, and more particularly to an encoding method and an encoding apparatus, a decoding method and an encoding apparatus, a transmission method and a transmission apparatus, and a recording medium, which are suitable when they are used in carrying out efficient encoding of digital data such as acoustic signal or audio (speech) signal, etc. to carry out transmission thereof or record it with respect to recording medium, and receiving or reproducing such signal at the decoding side to decode it.

Hitherto, as a technique for efficiently encoding audio signal such as speech (sound), etc., there are known, e.g., non-blocking frequency band division system represented by band division coding (sub-band coding), etc. and a blocking frequency band division system represented by transformation encoding, etc.

In the deblocking frequency band division system, audio signal on the time axis divided into signal components every plural frequency bands without carrying out blocking to carry out encoding thereof. Moreover, in the blocking frequency band division system, signal on the time axis is transformed (spectrum-transformed) into signal on the frequency axis to carry out division into signal components every plural frequency bands, i.e., to collect coefficients obtained by carrying out spectrum transformation every predetermined bands to carry out encoding every respective bands.

Further, as a technique for further improving encoding efficiency, there is also proposed a high efficient encoding technique in which the deblocking frequency band division system and the blocking frequency-band system as described above are combined. In accordance with this technique, e.g., band division is carried out by the band division encoding thereafter to carry out spectrum transformation of signal every respective bands into signal on the frequency axis so that encoding is carried out every respective bands of signal which has been caused to undergo spectrum transformation.

Here, in carrying out the frequency band division, since processing is simple and aliasing distortion is cancelled, there are many instances where, e.g., QMF (Quadrature Mirror Filter) is used. It is to be noted that the detail of the frequency band division by QMF is described in "1976R. E. Crochiere, Digital coding of speech in subbands, Bell Syst. Tech. J. Vol. 55, No. 8 1976", etc.

Further, as a technique for carrying out band division, in addition to the above, there is, e.g., POF (Polyphase Quadrature filter) which is filter division technique of equi-band width, etc. The detail of this PQF is described in "ICASSP 83 BOSTON, Polyphase Quadrature filters—A new subband coding technique, Joseph H. Rothweilier", etc.

On the other hand, as the above-described spectrum transformation, there is, e.g., spectrum transformation of blocking an input audio signal by frame of a predetermined unit time to carry out Discrete Fourier Transformation (DFT), Discrete Cosine Transformation (DCT), or Modified Discrete Cosine Transformation (MDCT), etc. to thereby transform time axis signal into frequency axis signal.

It is to be noted that the detail of MDCT is described in "ICASSP 1987, Subband/Transform Coding Using Filter Bank Designs Based on Time Domain Aliasing Cancellation, J. P. Princen, A. B. Bradley, Univ. of Surrey Royal Melbourne Inst. of Tech.", etc.

As described above, since signal every band obtained by filter or spectrum transformation is quantized to have ability to control band in which quantization noise is generated, it is possible to carry out higher efficient encoding in an auditory point of view by making used of the masking effect, etc. Moreover, if signal components every respective bands are normalized by, e.g., the maximum value of absolute value of signal component of corresponding band before quantization is carried out, it is possible to carry out higher efficient encoding.

The widths of respective frequency bands when band division is carried out are determined by taking, e.g., auditory characteristic of the human being into consideration. Namely, in general, there are instances where audio signal is divided into signal components every plural (e.g., 32, etc.) bands by band width such that according as frequency band shifts to higher frequency band, the width becomes broader, which is called, e.g., critical band.

Further, in encoding data every respective bands, a predetermined bit allocation every respective bands or adaptive bit allocation every respective bands is carried out. Namely, e.g., in encoding coefficient data obtained after undergone MDCT processing by bit allocation, the numbers of bits are adaptively allocated to MDCT coefficient data every respective bands obtained by MDCT-processing signals every blocks so that encoding is carried out.

As the bit allocation technique, there are known, e.g., a technique of carrying out bit allocation on the basis of magnitudes of signals every respective bands (hereinafter referred to as a first bit allocation technique as occasion demands) and a technique of obtaining necessary signal-to-noise ratios every respective bands by making use of auditory masking to carry out fixed bit allocation (hereinafter refereed to as a second bit allocation technique as occasion demands), etc.

It is to be noted that the detail of the first bit allocation technique is described in, e.g., "Adaptive Transform coding of Speech Signals, R. Zelinski and P. Noll, IEEE Transactions of Acoustics, Speech and Signal Processing, Vol. ASSP-25, No. 4, Aug. 1977", etc.

Moreover, the detail of the second bit allocation technique is described in, e.g., "ICASSP 1980, The critical band coder digital encoding of the perceptual requirements of the auditory system, M. A. Kransner MIT", etc.

In accordance with the first bit allocation technique, quantization noise spectrum is flattened so that noise energy becomes minimum. However, since the masking effect is not utilized from an auditory point of view, noise feeling in view of actual auditory point of view does not become optimum. Moreover, in the second bit allocation technique, in the case where energy is concentrated on a certain frequency, even in the case where, e.g., sine wave, etc. is inputted, since bit allocation is fixed, the characteristic value does not become so much good value.

In view of the above, there is proposed a high efficient encoding apparatus in which all bits which can be used for bit allocation are used in the state divided into bits for fixed bit allocation pattern determined in advance every respective small blocks and bits for carrying out bit allocation dependent upon magnitudes of signals of respective blocks to allow its divisional ratio to be dependent upon signal related to input signal, i.e., according as, e.g., spectrum of corresponding signal becomes smooth, divisional ratio with respect to bits for the fixed bit allocation pattern becomes large.

In accordance with this method, in the case where energy is concentrated on a specific spectrum like sine wave input, many bits are allocated to block including that spectrum. Thus, the entire signal-to-noise characteristic can be dramatically improved. In general, since the auditory sense of the human being is extremely sensitive to signal having sharp spectrum component, the fact that the signal-to-noise characteristic is improved in a manner as described above, not only improves numeric value in measurement but also is effective in improvement of sound quality from viewpoint of auditory sense.

As a method for bit allocation, a large number of methods are proposed in addition to the above. If model relating to auditory sense further becomes fine and the ability of the encoding apparatus is improved, encoding which is higher efficient from a viewpoint of auditory sense can be made.

In the case where DFT or DCT is used as a method of transforming waveform signal into spectrum, when transformation is carried out by time block consisting of M samples, M independent actual number data are obtained. However, since one block is ordinarily constituted in the state overlapping with both adjacent blocks respectively by predetermined number (M1) of samples in order to reduce connection distortion between time blocks (frames), M actual number data are quantized with respect to (M–M1) samples in average and encoded in the encoding method utilizing DFI or DCT.

Moreover, in the case where MDCT is used as a method of transforming signal on the time axis into spectrum, independent M data are obtained from 2M samples overlapping with both adjacent blocks by M samples. Accordingly, in this case, M actual number data are quantized and encoded with respect to M samples on the average. In this case, at the decoding apparatus, waveform elements obtained by implementing inverse transformation at respective blocks from codes obtained by using MDCT as described above are added while allowing them to interfere with each other so that waveform signal is reconstructed.

In general, by elongating time block (frame) for transformation, frequency resolution of spectrum is enhanced so that energy is concentrated to a specific spectrum component. Accordingly, in the case where there is used MDCT in which transformation is carried out by long block length in the state overlapping with both adjacent blocks by halves and the number of spectrum signals obtained is not increased with respect to the number of original time samples, it becomes possible to carry out higher efficient encoding as compared to the case where DFT or DCT is used. In addition, adjacent blocks are caused to have sufficiently long overlap, thereby also making it possible to reduce distortion between blocks of waveform signal.

In constituting actual code train, first, every bands where normalization and quantization are carried out, quantization accuracy information which is information indicating quantization step when quantization is carried out and normalization information which is information indicating coefficients used for normalizing respective signal components are encoded by a predetermined number of bits every band where normalization and quantization are carried out, and the normalized and quantized spectrum signal is then encoded.

Here, e.g., in the "IDO/IEC 11172-3: 1993 (E), 1993", there is described efficient encoding system set so that the number of bits indicating quantization accuracy information are caused to be different in dependency upon band. In accordance with this system, normalization is carried out so that according as the frequency band shifts to higher frequency band, the number of bits indicating quantization accuracy information becomes smaller.

An example of the configuration of a conventional encoding apparatus adapted for carrying out, e.g., frequency band division of audio signal to carry out encoding thereof is shown in FIG. 1. An audio signal to be encoded is inputted to a band division unit 101, at which it is divided into, e.g., signals of four frequency bands.

Here, at the band division unit 101, filter such as the above-described QMF or PQF, etc. may be also used to carry out band division. Moreover, spectrum transformation such as MDCT, etc. may be also carried out to carry out grouping of spectrum signals obtained as the result thereof every bands to thereby carry out band division.

It is to be noted that widths of respective bands when band division of audio signal is carried out at the band division unit 101 (hereinafter referred to as encoding unit as occasion demands) may be uniform, or may not be uniform in a manner caused to be in correspondence with critical frequency band, etc. Moreover, while the audio signal in FIG. 1 is divided into four encoding units, the number of encoding units is not limited to this.

Signals decompressed into four encoding units (four encoding units will be respectively referred to as the first~fourth encoding units hereinafter) are delivered to a quantization accuracy determination unit 103 every predetermined time block (frame). Further, signals of the first~fourth encoding units are also respectively delivered to normalization units $102_1$~$102_4$.

The normalization units $102_1$~$102_4$ extract signal component in which the absolute is maximum from, e.g., respective signal components constituting respective signals of the inputted first~fourth encoding units to allow coefficient corresponding to this value to be normalization coefficients of the first~fourth encoding units. Further, at the normalization units $102_1$~$102_4$, respective signal components constituting signals of the first~fourth encoding units are respectively (divided) by values corresponding to normalization coefficients of the first~fourth encoding units. Accordingly, in this case, normalized data obtained by normalization become value within the range of −1.0~1.0.

The normalized data are respectively outputted from the normalization units $102_1$~$102_4$ to quantization units $104_1$~$104_4$. Moreover, normalization coefficients of the first~fourth encoding units are respectively from the normalization units $102_1$~$102_4$ to a multiplexer 105.

To the quantization units $104_1$~$104_4$, normalized data of the first~fourth units are delivered from the respective normalization units $102_1$~$102_4$, and quantization accuracy information for indicating quantization step when normalized data of the first~fourth encoding units are quantized are also delivered from the quantization accuracy determination unit 103.

Namely, the quantization accuracy determination unit 103 determines, on the basis of signals of the first~fourth encoding units from the band division unit 101, quantization step in quantizing respective normalized data of the first~fourth encoding units from the band division unit 101, quantization step in quantizing respective normalized data of the first~fourth encoding units. Further, quantization accuracy information of the first~fourth encoding units corresponding to that quantization step are respectively outputted to the quantization units $104_1$~$104_4$, and are also outputted to the multiplexer 105.

At the quantization units $104_1$~$104_4$, normalized data of the first~fourth encoding units are respectively quantized by quantization steps corresponding to quantization accuracy information of the first~fourth encoding units so that they are encoded. Quantization coefficients of the first~fourth encoding units obtained as the result thereof are outputted to the multiplexer 105 At the multiplexer 105, quantization coefficients, quantization accuracy information and normalization coefficients of the first~fourth encoding units are encoded as occasion demands, and are then multiplexed. Further, encoded data obtained as the result thereof is caused to undergo transmission through transmission path, or is recorded with respect to a recording medium 106.

It is to be noted that, at the quantization accuracy determination unit 103, determination of quantization step is not only carried out on the basis of signal obtained after undergone band division, but also may be carried out, e.g., on the basis of normalization data or may be carried out by taking auditory sense phenomenon, such as masking effect, etc. into consideration.

An example of the configuration of a decoding apparatus adapted for decoding encoded data outputted from the encoding apparatus having such a configuration is shown in FIG. 2. In FIG. 2, encoded data is inputted to a demultiplexer 121, at which it is decoded. The decoded data thus obtained is separated into quantization coefficients, quantization accuracy information and normalization coefficients of the first~fourth encoding units. The quantization. coefficients, the quantization accuracy information and the normalization information of the first~fourth encoding units are delivered to signal component constituting units $122_1$~$122_4$ corresponding to respective encoding units.

At the signal component constituting unit $122_1$, quantization coefficient of the first encoding unit is inverse-quantized by quantization step corresponding to quantization accuracy information of the first encoding unit. Thus, such quantization coefficient is caused to be normalized data of the first encoding unit. Further, at the signal component constituting unit $122_1$, normalized data of the first encoding unit is multiplexed by value corresponding to normalization coefficient of the first encoding unit. Thus, signal of the first encoding unit is decoded, and is outputted to a band synthesis unit 123.

Also, at the signal component constituting units $122_2$~$122_4$, similar processing are carried out. Thus, signals of the second~fourth encoding units are decoded, and are outputted to the band synthesis unit 123. At the band synthesis unit 123, signals of the first~fourth encoding units are band-synthesized. Thus, original audio signal is restored (reconstructed).

Meanwhile, since quantization accuracy information is included in encoded data delivered (transmitted) from the encoding apparatus of FIG. 1 to the decoding apparatus of FIG. 2, auditory model used in the decoding apparatus can be arbitrarily set. Namely, at the encoding apparatus, it is possible to freely set quantization steps with respect to respective encoding units, and it is possible to realize improvement in sound quality and/or improvement in compression ratio without changing the decoding apparatus with improvement in arithmetic (computing) ability and/or realization of fineness of the auditory sense model.

However, in this case, the number of bits for encoding quantization accuracy information itself becomes large. As a result, it was difficult to improve the entire encoding efficiency so that it becomes equal to a certain value or more.

In view of the above, in place of directly encoding quantization accuracy information, there is, e.g., a method of determining quantization accuracy information from normalization coefficients at the decoding apparatus. However, in this method, since the relationship between normalization coefficients and quantization accuracy information is determined at the time point when the standard has been determined, there is the problem that it becomes difficult to introduce control of quantization accuracy based on higher level auditory sense model in future. Moreover, in the case where there is width in compression ratio to be realized, there takes place the necessity of determining the relationship between normalization coefficients and quantization accuracy information every compression ratio.

Accordingly, in order to further improve the compression ratio, not only encoding efficiency of main information directly subject to encoding is enhanced, but also it becomes necessary to enhance encoding efficiency of sub-information which is not directly subject to encoding such as quantization accuracy information or normalization coefficient, etc.

Since such quantization accuracy information and/or normalization coefficients, etc. have, in many cases, correlation between adjacent normalization units, between adjacent channels, or between adjacent times, there are many cases where difference value between information of high correlation is determined to encode that difference value by using variable length code book (table). In this technique, encoding efficiency can be enhanced as compared to the case where information is encoded as it is without using difference, but there was the problem that size of code book (table) becomes large on the contrary.

Consideration is made in connection with the case where, e.g., distribution range of the quantization accuracy information is 0~7, and encoding is carried out by 3 bits. In the case where the quantization accuracy information is encoded as it is, code book (table) size is 8. To the contrary, in the case where difference value is encoded, that difference value is broadened to about double range of −7~7, and size of code book (table) becomes about double value from 8 to 15 as shown in FIG. 3. Further, in the case where difference value of difference value is encoded, the distribution range is broadened to about four times of −14~14, and size of code book (table) becomes about four times value from 8 to 29 as shown in FIG. 4.

In addition, although variable length code is prepared in accordance with the probability distribution, long code is allocated to value of low appearance probability. As a result, there was the problem that the number of bits to be encoded is increased to much extent as compared to the case where variable length code book (table) is not used.

SUMMARY OF THE INVENTION

The present invention has been proposed in view of such conventional actual circumstances, and its object is to provide an encoding method and an encoding apparatus, a decoding method and a decoding apparatus, a transmission method and a transmission apparatus, and a recording medium which permit efficient encoding without enlarging code book (table).

To attain the above-described object, an encoding method according to the present invention is directed to an encoding method of encoding a predetermined information value, comprising: a difference value calculation step of determining difference value between the information vales; a transformation step of transforming the difference value so that the range of value where transformed difference value can take becomes smaller than the range of value where difference value can primarily take; and an encoding step of encoding the transformed difference value.

Here, in the encoding method, when magnitude of the range of value where the information value can take is N, magnitude of the range of value where transformed difference value at the transformation step is caused to be N. At this time, at the transformation step, two difference values where difference is N can be transformed in to the same value.

Moreover, in the encoding method, in the case where magnitude N of the range of value where the information value can take is n power of 2, transformation is carried out at the transformation step such that only low order n bits of output of the difference value calculation step is taken out, and the difference value transformed into n bits is encoded at the encoding step.

In such encoding method, in encoding a predetermined information value, difference value between the information values is transformed so that the range of value where transformed difference value can take becomes smaller than the range of value where difference value can primarily take, and is then encoded.

Further, in order to attain the above-described object, an encoding apparatus according to the present invention is directed to an encoding apparatus adapted for encoding a predetermined information value, comprising: difference value calculating means for determining difference value between the information values; transforming means for transforming the difference value so that the range of value where transformed difference value can take becomes smaller than the range where difference value can primarily take; and encoding means for encoding the transformed difference value.

Here, in the encoding apparatus, when magnitude of the range of value where the information value can take is N, magnitude of the range of value where difference value transformed by the transforming means can take is caused to be N. At this time, the transforming means can transform two difference values in which difference is N into the same value.

In encoding a predetermined information value, such encoding apparatus transforms difference value between the information values so that the range of value where transformed difference value can take becomes smaller than the range of value where difference value can primarily take.

Further, in order to attain the above-described object, a decoding method according to the present invention is directed to a decoding method of inputting transformed difference value encoded by an encoding method of determining difference value of a predetermined information value to transform the difference value so that the range of value where transformed difference value can take becomes smaller than the range of value where difference value can primarily take to encode the transformed difference value to decode the transformed difference value, the decoding method including: a difference value decoding step of decoding the transformed difference value; and an information value restoring step of determining primary information value by using the transformed difference value decoded at the difference value decoding step.

Here, in the decoding method, when magnitude of the range of value where difference value decoded at the difference value decoding step can primarily take is N, magnitude of the range of value where information value restored at the information value restoring step can take is caused be N. At this time, with respect to one difference value decoded at the difference value decoding step, either of two information values such that difference therebetween is N can be restored as information value.

Further, in the decoding method, in the case where magnitude N of the range of value where the information value can take is n power of 2, difference value transformed and encoded so that the difference value becomes n bits is inputted, the difference value of n bits is decoded at the difference value decoding step, and only low order n bits of information value calculated by using the decoded difference value is taken out at the information value restoring step, whereby primary information value can be determined.

In such a decoding method, in encoding a predetermined information value, difference value between the information values is transformed so that the range of value where transformed difference value can take becomes smaller than the range of value where difference value can primarily take, and encoded difference value is then inputted. After this transformed difference value is decoded, primary information value is restored by using this decoded difference value.

Further, in order to attain the above-described object, a decoding apparatus according to the present invention is directed to a decoding apparatus adapted for inputting transformed difference value encoded by an encoding method of determining difference value of a predetermined information value to transform the difference value so that the range of value where transformed difference value can take becomes smaller than the range of value where difference value can primarily take to encode the transformed difference value to decode the information value, the decoding apparatus comprising: difference value decoding means for decoding the transformed difference value; and information value restoring means for determining primary information value by using the transformed difference value decoded by the difference value decoding means.

Here, in the decoding apparatus, when magnitude of the range of value where difference value decoded by the difference value decoding means can primarily take is N, magnitude of the range of value where information value restored by the information restoring means can take is caused to be N. At this time, with respect to one difference value decoded by the difference value decoding means, the information value restoring means can restore, as information value, either one of two information values such that difference therebetween is N.

In such decoding apparatus, in encoding a predetermined information value, difference value between the information values is transformed so that the range of value where transformed difference value can take becomes smaller than the range of value where difference value can primarily take, and encoded difference value is then inputted. After this transformed difference value is decoded, primary information value is restored by using this decoded difference value.

Further, in order to attain the above-described object, a transmission method according to the present invention is directed to a transmission method of encoding a predetermined information value to carry out transmission thereof, the transmission method including: a difference value calculation step of determining difference value between the information values; a transformation step of transforming the difference value so that the range of value where transformed difference value can take becomes smaller than the range of value where difference value can primarily take; an encoding step of encoding the transformed difference value; and a transmission step of carrying out transmission of the encoded transformed difference value.

Here, in the transmission method, when magnitude of the range of value where the information value can take is N, magnitude of the range of value where difference value after undergone transformation at the transformation step can take is caused to be N. At this time, two difference values where difference is N can be transformed into the same value.

In such a transmission method, in encoding a predetermined information value to carry out transmission thereof, difference value between the information values is transformed so that the range of value where transformed difference value can take becomes smaller than the range of value where difference value can primarily take thereafter to encode the transformed difference value to carry out transmission thereof.

Further, in order to attain the above-described object, a transmission apparatus according to the present invention is directed to a transmission apparatus adapted for encoding a predetermined information value to carry out transmission thereof, the transmission apparatus including: difference value calculating means for determining difference value between the information values; transforming means for transforming the difference value so that the range of value where transformed difference value can take becomes smaller than the range of value where difference value can primarily take; encoding means for encoding the transformed difference value; and transmission means for carrying out transmission of the encoded transformed difference value.

Here, in the transmission apparatus, when magnitude of the range of value where the information value can take is N, magnitude of the range of value where difference value transformed by the transforming means can take is caused to be N. At this time, the transforming means can transform two difference values where difference therebetween is N into the same value.

In encoding a predetermined information value to carry out transmission thereof, such transmission apparatus transforms difference value between the information values so that the range of value where transformed difference value can take becomes smaller than the range where difference value can primarily take thereafter to encode it to carry out transmission thereof.

In addition, in order to attain the above-described object, a recording medium according to the present invention is adapted so that there is recorded transformed difference value encoded by an encoding method including a difference value calculation step of determining difference value between predetermined information values, a transformation step of transforming the difference value so that the range of value where transformed difference value can take becomes smaller than the range of value where difference vale can primarily take, and an encoding step of encoding the transformed difference value.

Here, in the encoding method, when magnitude of the range of value where the information value can take is N, magnitude of the range of value where transferred difference value at the transformation step can take is caused to be N. At this time, at the transformation step, two difference values where difference is N is permitted to undergo mapping into the same value.

With respect to such recording medium, there is recorded difference value in which, in encoding a predetermined information value, difference value between the information values is transformed so that the range of value where transformed difference value can take becomes smaller than the range of value where difference value can primarily take, and is then encoded.

Still further objects of the present invention and practical merits obtained by the present invention will become more apparent from the description of the embodiments which will be given below.

BRIEF DESCRIPTION OF THE DRAWINGS

FIG. 3 is a view showing a conventional variable length code book (table) in the case where difference value is encoded.

FIG. 4 is a view showing a conventional variable length code book (table) in the case where difference value of difference value is encoded.

FIG. 9 is a view showing a practical example in which difference value is transformed at the quantization accuracy information encoding unit.

FIG. 10 is a view showing an example where the number of bits to be encoded is reduced at the quantization accuracy information encoding unit.

DETAILED DESCRIPTION OF THE PRESENTLY PREFERRED EMBODIMENTS

Explanation will now be given in detail with reference to the attached drawings in connection with practical embodiments to which the present invention is applied. In this embodiment, the present invention is applied to an encoding apparatus and a decoding appartus which are adapted for carrying out efficient encoding of audio signal, etc. to carry out transmission thereof or to record it with respect to recording medium, and are adapted for receiving or reproducing it at the decoding side to decode it. It is to be noted that while explanation will be given below on the premise that audio signal is caused to undergo efficient encoding, the present invention is not limited to such implementation, but, e.g., video signal may be also employed. Further, while explanation will be given below on the premise that the present invention is applied when sub-information which are not directly subject to encoding are encoded and decoded such as quantization accuracy information and/or normalization coefficients, etc., this is merely one example and the present invention is not limited to such an example.

Figure 1:
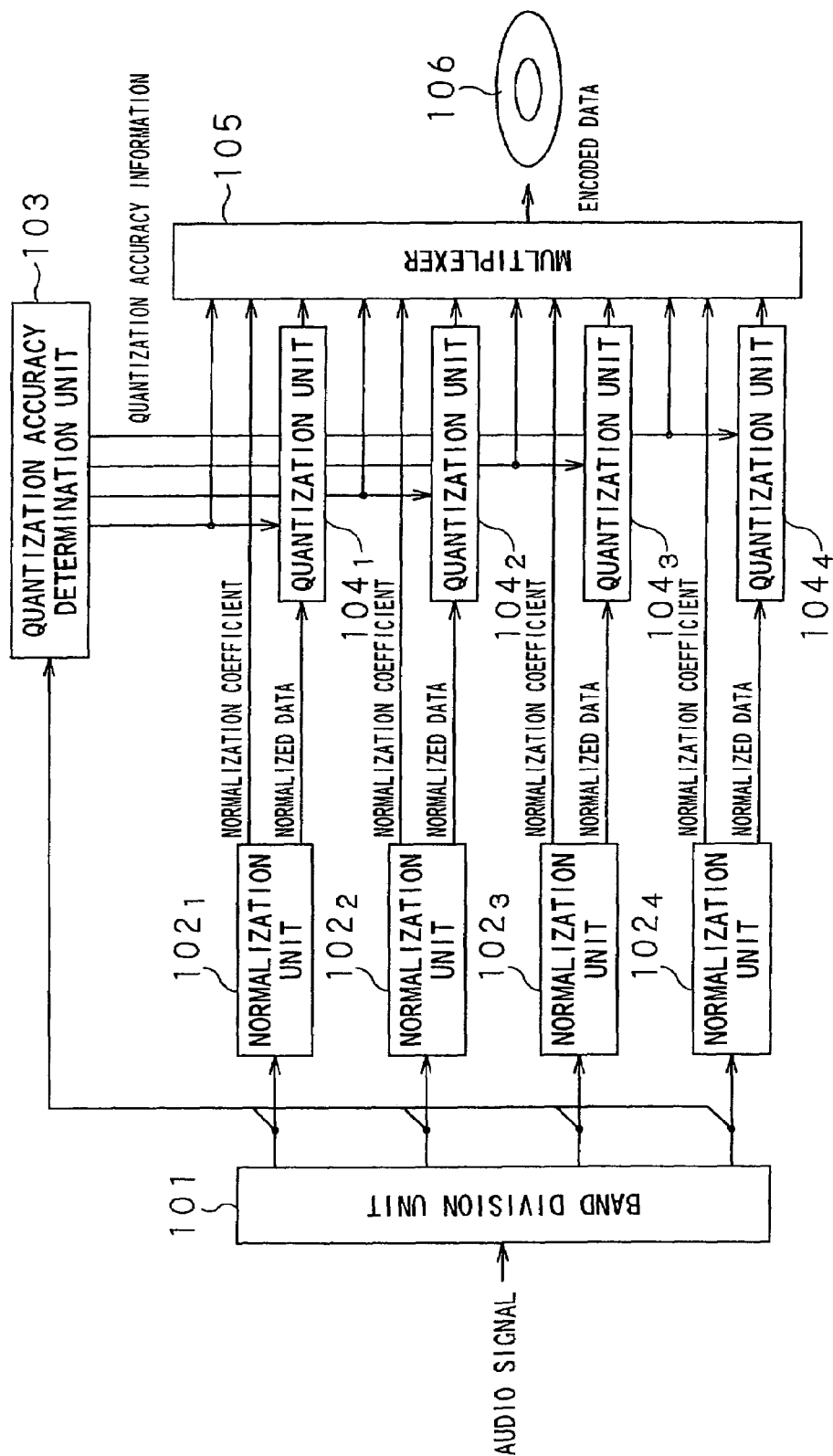
FIG. 1 is a view for explaining the configuration of a conventional encoding apparatus.
Figure 2:
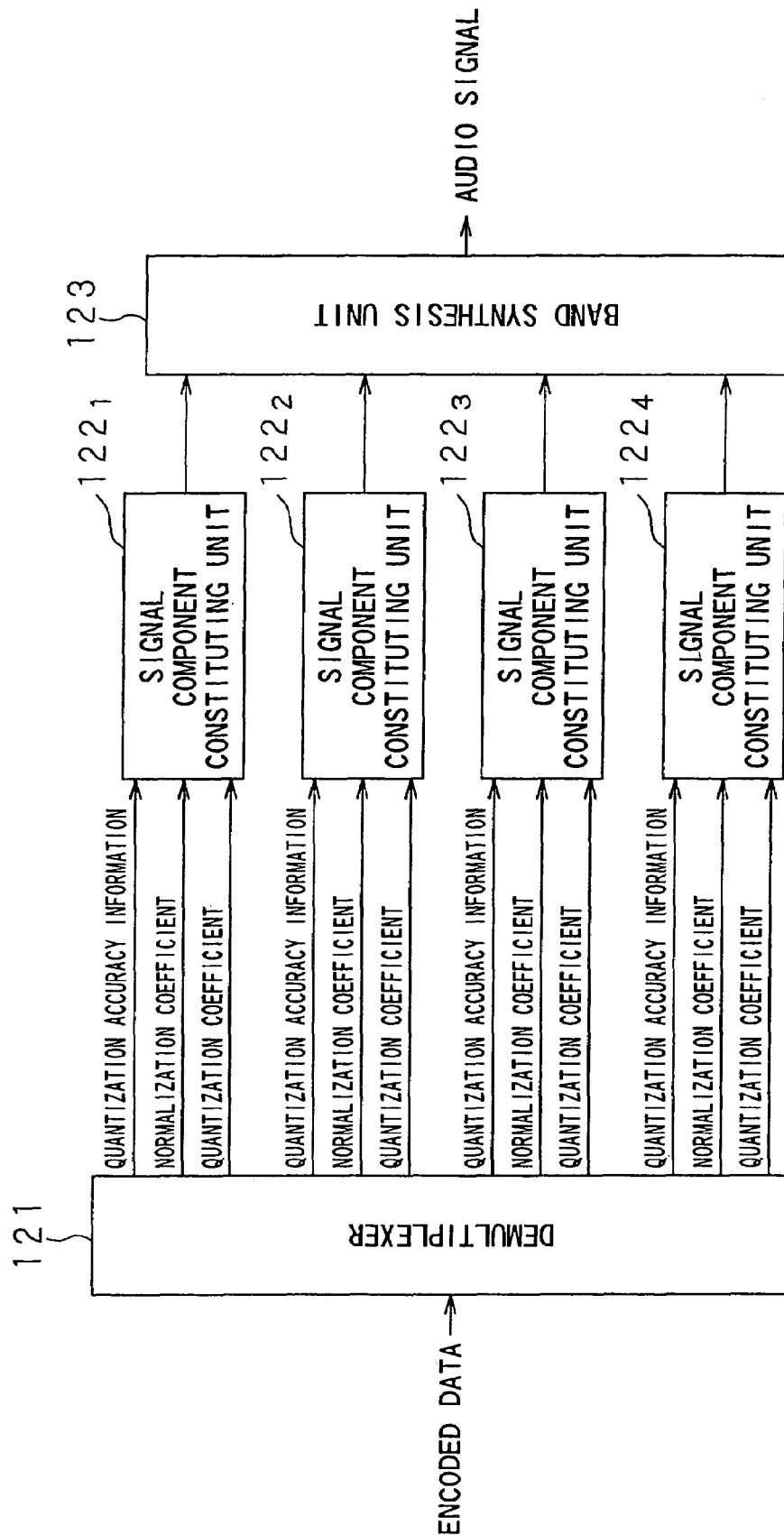
FIG. 2 is a view for explaining the configuration of a conventional decoding apparatus.
Figure 5:
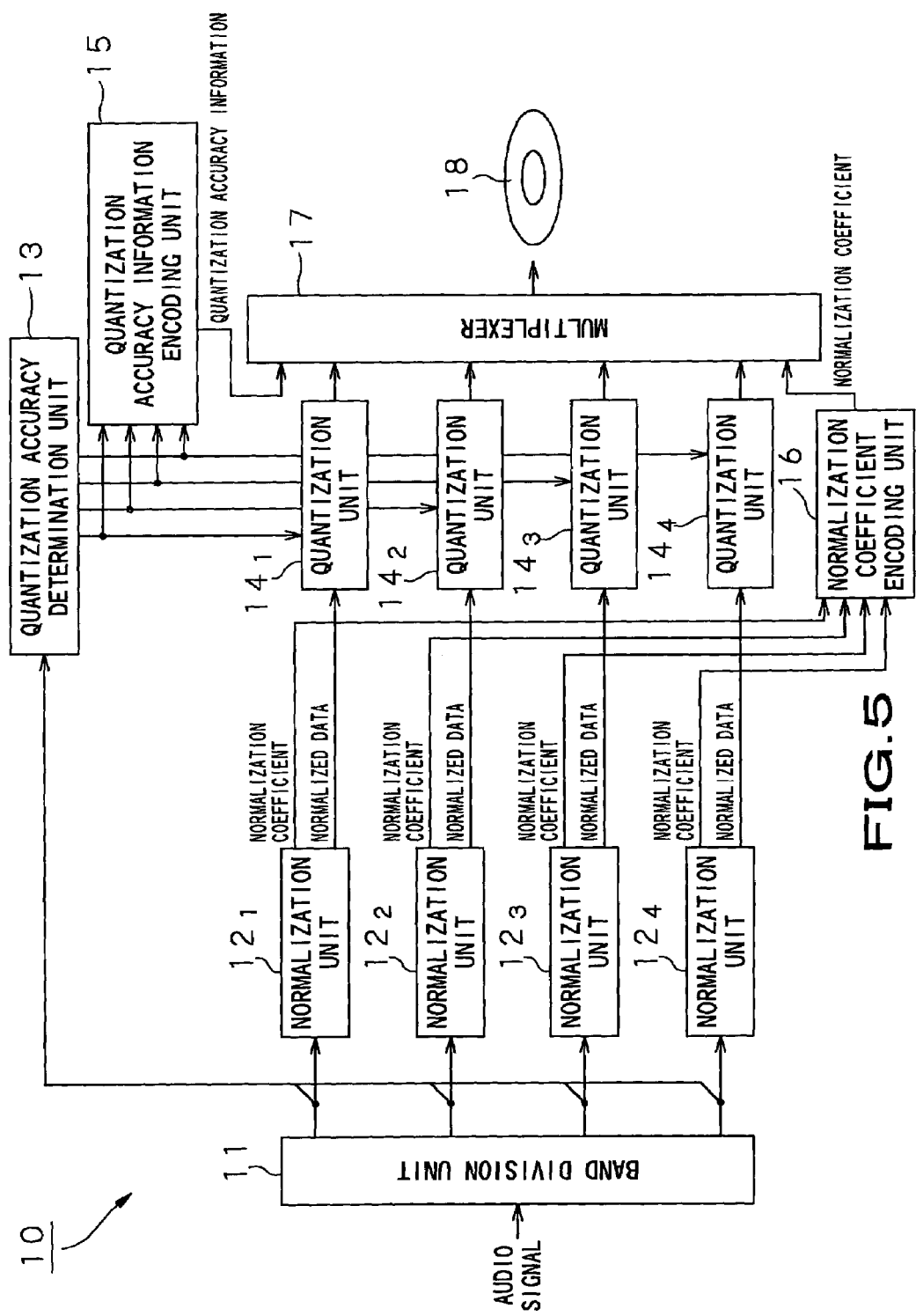
FIG. 5 is a view for explaining the configuration of an encoding apparatus in this embodiment.

First, the configuration of an encoding apparatus 10 in this embodiment is shown in FIG. 5. In FIG. 5, an audio signal to be encoded is inputted to a band division unit 11, at which it is band-divided into, e.g., signals of four frequency bands.

Here, at the band division unit 11, filter such as QMF (Quadrature Mirror Filter) or PQF (Polyphase Quadrature Filter), etc. may also be used to carry out band division. Moreover, spectrum transformation such as MDCT (Modified Discrete Cosine Transformation), etc. may be also carried out to carry out grouping of spectrum signals obtained as the result thereof every band to thereby carry out band division.

It is to be noted that widths of respective bands (hereinafter referred to as encoding unit as occasion demands) when audio signal is caused to undergo band division at the band division unit 11 may be uniform, or may not be uniform in a manner to be in correspondence with the critical band width. Moreover, while audio signal is divided into four encoding units, the number of encoding units is not limited to this.

Signals decomposed into four encoding units (four encoding units are respectively referred to as first~fourth encoding units hereinafter as occasion demands) are delivered to a quantization accuracy determination unit 13 every predetermined time block (frame). Further, the signals of the first~fourth encoding units are also respectively delivered to normalization units $12_1$~$12_4$.

The normalization units $12_1$~$12_4$ extract signal components in which the absolute value is maximum from respective signal components constituting, e.g., respective inputted first~fourth encoding units to allow coefficients corresponding to these values to be normalization coefficients of the first~fourth encoding units. Further, at the normalization units $12_1$~$12_4$, respective signal components constituting signals of the first~fourth encoding units are respectively divided by values corresponding to normalization coefficients of the first~fourth encoding units. Thus, they are normalized. Accordingly, in this case, normalized data obtained by normalization takes value of the range of −1.0~1.0.

Normalized data are respectively outputted from the normalization units $12_1$~$12_4$ to the quantization units $14_1$~$14_4$. Moreover, normalization coefficients of the first~fourth encoding units are outputted from the respective normalization units $12_1$~$12_4$ to a normalization coefficient encoding unit 16. After difference values with respect to adjacent units are caused to undergo variable length encoding by method which will be described later, such encoded difference values are outputted to a multiplexer 17.

To the quantization units $14_1$~$14_4$, normalized data of the first~fourth encoding units are delivered from the respective normalization units $12_1$~$12_4$, and quantization accuracy information for designating quantization steps in quantizing normalized data of the first~fourth encoding units are also delivered from the quantization accuracy determination unit 13.

Namely, the quantization accuracy determination unit 13 determines. quantization steps in quantizing respective normalized data of the first~fourth encoding units on the basis of signals of the first~fourth encoding units from the band division unit 11. Further, the quantization accuracy determination unit 13 respectively outputs quantization accuracy information of the first~fourth encoding units corresponding to those quantization steps to the quantization units $14_1$~$14_4$, and also output them to a quantization accuracy information encoding unit 15. The quantization accuracy information encoding unit 15 allows difference values of quantization accuracy information with respect to adjacent unit to undergo variable length encoding in a manner as described later thereafter to output them to the multiplexer 17.

At the quantization units $14_1$~$14_4$, normalized data of the first~fourth units are respectively quantized by quantization steps corresponding to quantization accuracy information of the first~fourth encoding units so that they are encoded, and quantization coefficients of the first~fourth encoding units obtained as the result thereof are outputted to the multiplexer 17. At the multiplexer 17, quantization coefficients of the first~fourth encoding units are encoded, and are multiplexed together with quantization accuracy information encoded at the quantization accuracy information encoding unit 15 and normalization coefficients encoded at the normalization coefficient encoding unit 16. Further, encoded data obtained as an output of the multiplexer 17 is caused to undergo transmission through transmission path, or is recorded with respect to a recording medium 18.

As described above, in the encoding apparatus 10 in this embodiment, audio signal serving as main information which is directly subject to encoding and quantization accuracy information and normalization coefficient serving as sub-information which are not directly subject to encoding are separately encoded.

Figure 6:
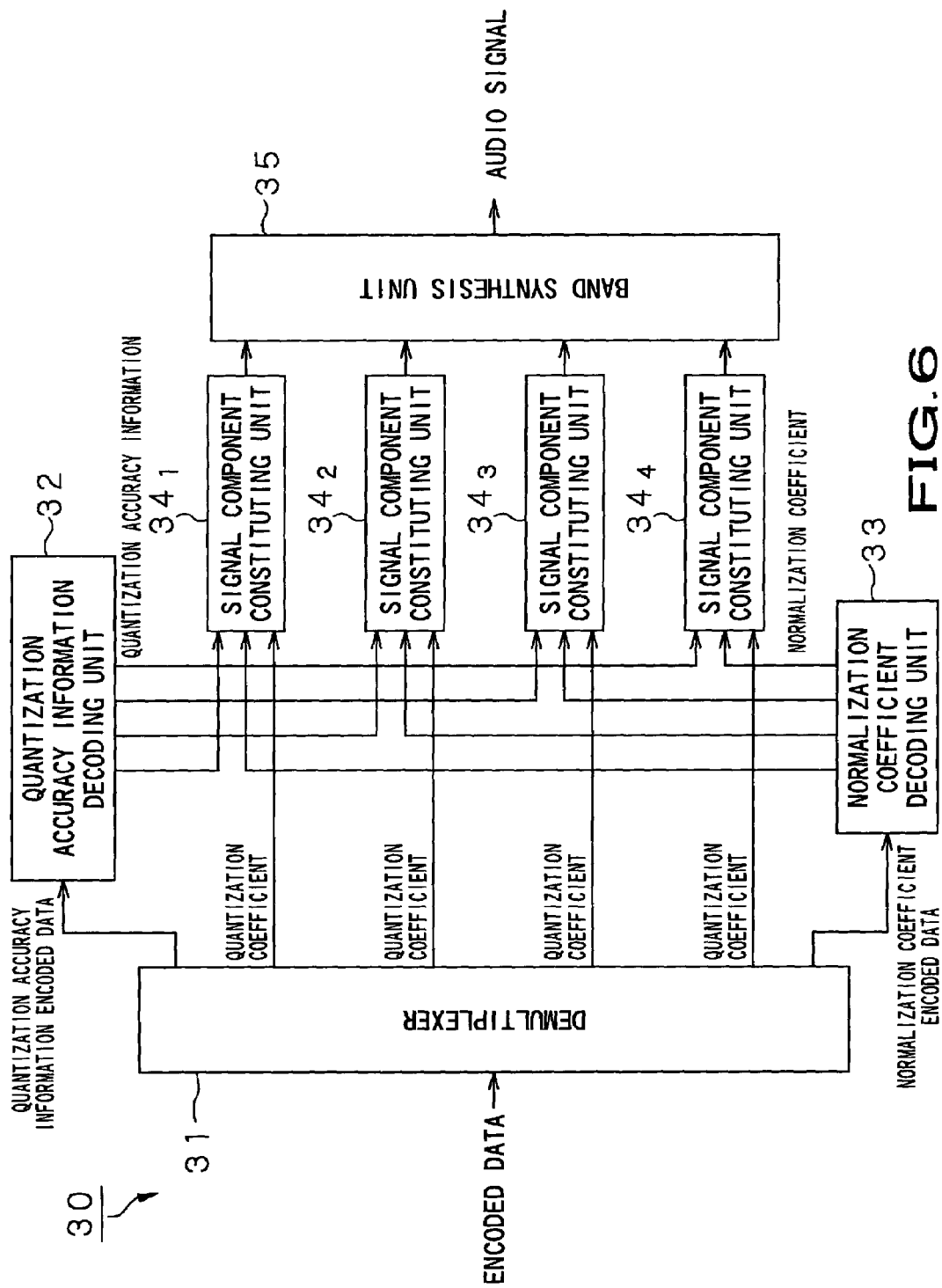
FIG. 6 is a view for explaining the configuration of a decoding apparatus in this embodiment.

Then, the configuration of a decoding apparatus 30 in this embodiment is shown in FIG. 6. In FIG. 6, encoded data is inputted to a demultiplexer 31, at which it is decoded in a manner separated into quantization coefficients, quantization accuracy information and normalization coefficients of the first~fourth encoding units. The quantization coefficients of the first~fourth encoding units are delivered to signal component constituting units $34_1$~$34_4$ corresponding to respective encoding units. Moreover, the quantization accuracy information and the normalization coefficients are respectively decoded at a quantization accuracy information decoding unit 32 and a normalization coefficient decoding unit 33, and are then delivered to signal component constituting units $34_1$~$34_4$ corresponding to respective encoding units.

At the signal component constituting unit $34_1$, quantization coefficient of the first encoding unit is inverse-quantized by quantization step corresponding to quantization accuracy information of the first encoding unit. Thus, such inverse-quantized quantization coefficient is caused to be normalized data of the first encoding unit. Further, at the signal component constituting unit $34_1$, normalized data of the first encoding unit is multiplied by value corresponding to normalization coefficient of the first encoding unit. Thus, signal of the first encoding unit is decoded, and is outputted to a band synthesis unit 35.

Also at the signal component constituting units $34_2 \sim 34_4$, similar processing is carried out. Thus, signals of the second~fourth units are decoded, and are outputted to the band synthesis unit 35. At the band synthesis unit 35, signals of the first~fourth encoding units are band-synthesized. Thus, original audio signal is restored.

Meanwhile, at the quantization accuracy information encoding unit 15 and the normalization coefficient encoding unit 16 at the encoding apparatus 10 in this embodiment, difference values of quantization accuracy information and normalization coefficients are caused to undergo variable length encoding. In this instance, transformation processing is implemented to difference value so that there results the same size in the case where size of variable length code book (table) does not take difference.

In view of the above, explanation will be given below in connection with an encoding method for difference value of information such as quantization accuracy information and/or normalization coefficient, etc. and a decoding method for information encoded by that encoding method.

It is to be noted that since encoding method are decoding method for quantization accuracy information and encoding method and decoding method for normalization coefficient are similar to each other, explanation will be given below only in connection with the encoding method for quantization accuracy information at the above-described quantization accuracy information encoding unit 15 and the decoding method for quantization accuracy information at the quantization accuracy information decoding unit 32. In addition, while explanation will be given on the assumption that the distribution range of quantization accuracy information is 0~7, it is a matter of course that the distribution range is not limited to this range.

Figures 7, 8:
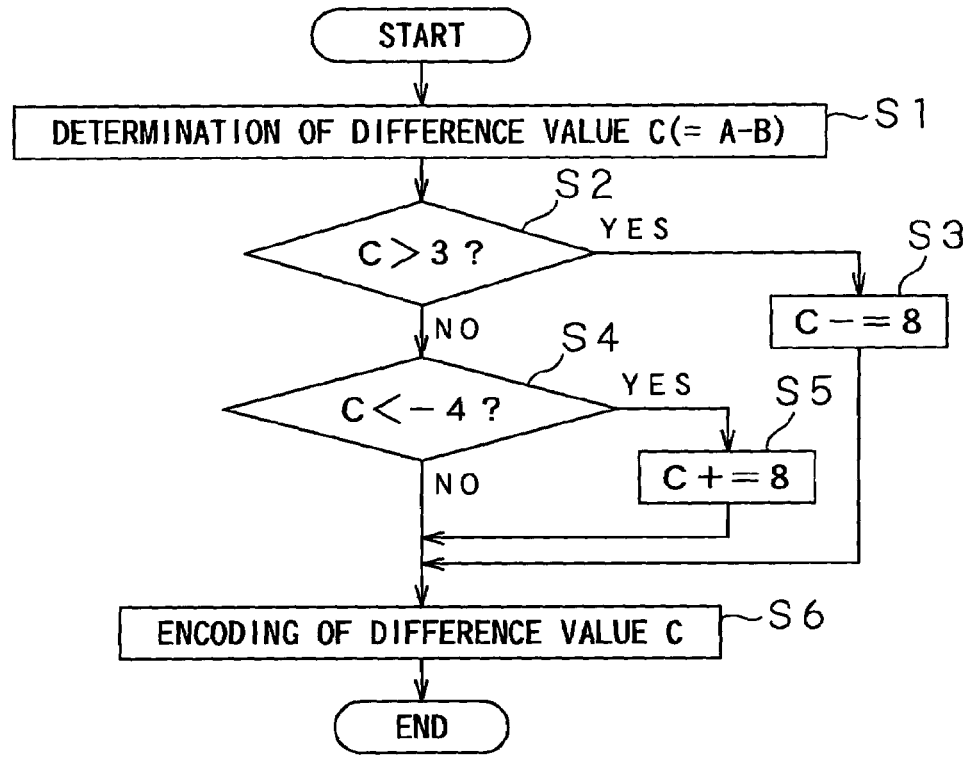
FIG. 7 is a flowchart for explaining transformation processing of difference value in quantization accuracy information encoding unit of the encoding apparatus.
FIG. 8 is a view for explaining code book (table) used for encoding transformed difference value at the quantization accuracy information encoding unit.

First, explanation will be given by using the flowchart of FIG. 7 in connection with the encoding method for quantization accuracy information in this embodiment. Initially, at step S1, difference value c is determined. Namely, in place of primarily encoding information value B, difference value C(=A-B) is calculated to encode this difference value C. It is to be noted that information value A is information value having high correlation with respect to information value B serving as reference in calculating difference value, and is value encoded prior to information value B. Here, as described above, since the distribution range of quantization accuracy information is 0~7, the distribution range of difference value C becomes −7~7.

Then, at the subsequent step S2, whether or not difference value C is 3 is discriminated. In the case where difference value C is more than 3 (YES), processing proceeds to step S3. In the case where difference value C is less than 3 (NO), processing proceeds to step S4.

At the step S3, 8 is subtracted from difference value C. Thereafter, processing proceeds to step S6 to encode difference value C to complete processing.

At the step S4, whether or not difference value C is less than −4 is discriminated. In the case where difference value C is less than −4 (YES), processing proceeds to step S5. In the case where difference value is more than −4 (NO), processing proceeds to step S6 to encode difference value C to complete processing.

At the step S5, 8 is added to difference value C. Thereafter, processing proceeds to the step S6 to encode difference value C to complete processing.

It is to be noted that value of 8 used at the steps S5 and S5 is the same value as 8 which is magnitude of the distribution range (0~7) of quantization accuracy information. Namely, in the case where, e.g., the distribution range of quantization accuracy information is 0~15 and magnitude of that distribution range is 16, value of 16 is used in addition/subtraction.

As stated above, by carrying out addition/subtraction of 8 which is the magnitude of the distribution range of quantization accuracy information, the distribution range of difference value C becomes −4~3. For this reason, it is sufficient to prepare variable length code books (tables) by that range. Namely, as shown in FIG. 8, size of code book (table) is 8, and this is the same size as code book (table) in the case where encoding is carried out without taking difference.

Explanation will be given below in such a manner that practical example is taken in FIG. 9. In the case of I of FIG. 9, information value A serving as reference value of difference is 0 and information value B to be primarily encoded is 7. For this reason, difference value C becomes −7. Since this difference value −7 is a value smaller than −4, 8 is added as described above. By this addition processing, difference value C is transformed from −7 to 1. Further, this difference value 1 is caused to actually undergo variable length encoding.

Moreover, in the case of II of FIG. 9, information value A serving as reference value of difference is 7 and information value B to be primarily encoded is 2. For this reason, difference value C becomes 5. Since this difference value 5 is a value larger than 3, 8 is subtracted as described above. By this subtraction processing, difference value C is transformed from 5 into −3. Further, this difference value 3 is caused to actually undergo variable length encoding.

In addition, in the case of III of FIG. 9, information value A serving as reference value of difference is 5 and information value B to be primarily encoded is 4. For this reason, difference value C becomes equal to 1. Since this difference value 1 is more than −4 and is less than 3, addition/subtraction is not carried out, and this difference value 1 is caused to undergo variable length encoding as it is.

An example where the number of bits to be encoded is reduced by this technique will be explained by using FIG. 10. In this example, difference value in which value of quantization accuracy information at a certain quantization unit is subtracted from value of quantization accuracy information at adjacent quantization unit of lower frequency band side is encoded. It is to be noted that encoding is carried out by using the variable length code book (table) previously described in FIG. 3 in the conventional technique, whereas encoding is carried out by using variable length code book (table) shown in FIG. 8 in the technique in this embodiment. As understood from FIG. 10, total number of bits to be encoded is 22 bits in the conventional technique, whereas that number of bits is 20 bits in the technique in this embodiment so that reduction of 2 bits is realized. This is because 7 bits were required for encoding of difference value 5 in the conventional technique at quantization unit where quantization unit number is 6, whereas only 5 bits are required for encoding since difference value 5 is transformed into −3 in the technique in this embodiment. Here, in this example, value of quantization accuracy information at quantization unit where quantization unit number is 0 is encoded by fixed length of 3 bits without using difference value.

It is to be noted that there may be employed an approach in which transformation of difference value is carried out only with respect to a portion of value where difference value can take, and transformation is not carried out with respect to the remaining portion. Namely, there may be also employed an approach in which, e.g., transformation is carried out only with respect to difference values −7, −6, 6, 7 such that the number of bits is 8 in the variable length code book (table) shown in FIG. 3, and encoding is carried out with respect to difference value of the range from −5 to 5 by using the variable length code book (table) of FIG. 3 as it is.

Subsequently, explanation will be given by using the flowchart of FIG. 11 in connection with a decoding method of decoding quantization accuracy information encoded by the above-described encoding method at the above-described quantization accuracy information decoding unit 32.

First, at step S10, difference value C is decoded from bit stream to determine information value B at the subsequent step S11. At this time, since value of information value A is already known, information value B can be determined by subtracting difference value C from information value A.

Then, at the subsequent step S12, whether or not information value B is more than 7 is discriminated. In the case where information value B is more than 7, processing proceeds to step S13 to subtract 8 from the information value B to complete processing. In the case where information value B is less than 7 at the step S12, processing proceeds to step S14.

At the step S14, whether information value B is less than 0 is discriminated. In the case where information value B is less than 0, processing proceeds to step S15 to add 8 to information value B to complete processing. In the case where information value B is more than 0 at the step S14, processing is completed. Namely, in the case where value of information value B is out of the range of the primary distribution range, addition/subtraction is carried out, whereby modification is made such that there results value within the distribution range. Thus, information value B can be decoded.

Explanation will be given below in such a manner that practical example is taken in FIG. 12. It is to be noted that the practical example of FIG. 12 corresponds to the above-described practical example of the encoding side taken in FIG. 9. In the case of I of FIG. 12, information value C is first decoded. Then, information value C is subtracted from information value A serving as reference value to determine information value B. In practical sense, 1 is subtracted from 0 so that information value B becomes equal to −1. Since this information value −1 is value less than 0, 8 is added as described above. Thus, information value 8 is transformed into 7. This value results in actual information value B.

Figures 11, 12:
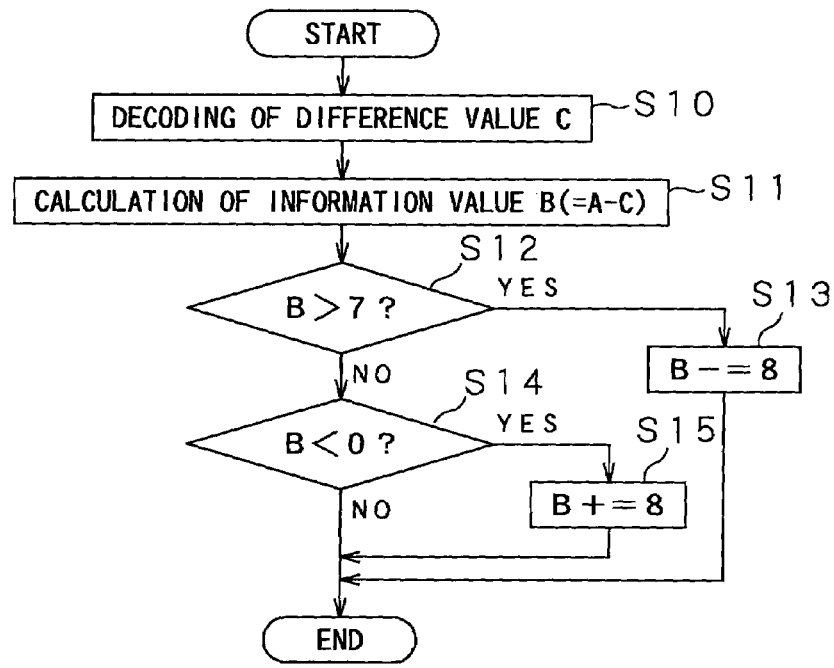
FIG. 11 is a flowchart for explaining decoding processing at quantization accuracy information decoding unit of the decoding apparatus.
FIG. 12 is a view showing practical example of decoding processing at the quantization accuracy information decoding unit.

Moreover, in the case of II of FIG. 12, similarly, −3 is subtracted from 7 so that information value B becomes equal to 10. Since this information value 10 is larger than 7, 8 is subtracted as described above. Thus, information value B is transformed into 3. This value results in actual information value B.

In addition, in the case of III of FIG. 12, similarly, 1 is subtracted from 5 so that information value B becomes equal to 4. Since this information value 4 is more than 0 and is less than 7, this value results in actual information value B as it is.

As described above, it has been indicated in FIG. 12 that value encoded in the above-described FIG. 9 can be completely restored.

Meanwhile, while explanation has been given in the above-described explanation on the assumption that when variable length encoding is carried out, if difference value is greater than 3, 8 is subtracted, while if difference value is smaller than −4, 8 is added, the present invention is not limited to this, and such an approach to transform two difference values where difference therebetween is 2 into the same value may be carried out. Namely, e.g., there may be also carried out such an operation that in the case where difference value is negative, 8 is added. Explanation will be given below in connection with the encoding processing and the decoding processing in this case.

Figures 13, 14:
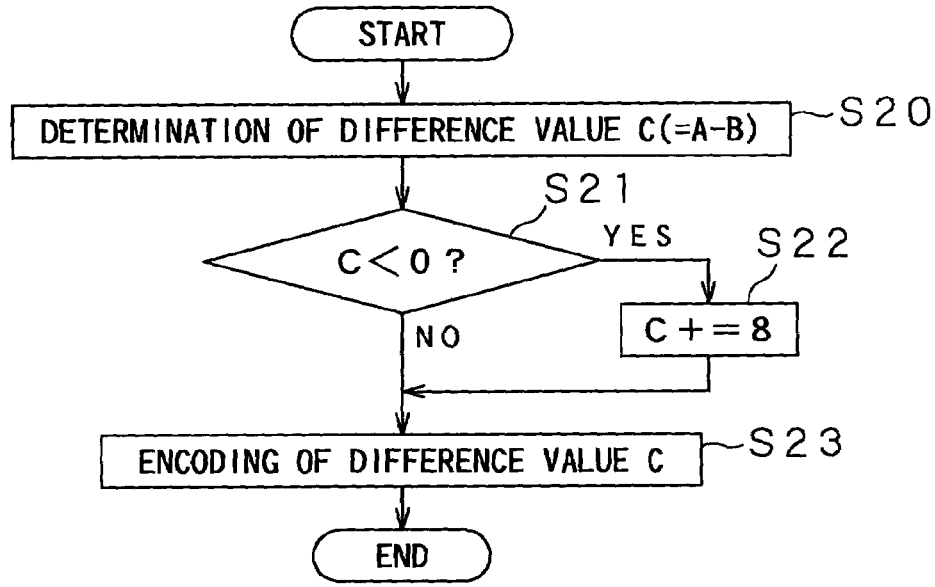
FIG. 13 is a flowchart for explaining another example of transformation processing of difference value at the quantization accuracy information encoding unit.
FIG. 14 is a view for explaining code book (table) used for encoding of transformed difference value is another example of the transformation processing.

In the encoding processing, as indicated by the flowchart of FIG. 13, first, at step S20, information value 8 is subtracted from information value A serving as reference value to determine difference value C. Here, since the distribution range of quantization accuracy information is 0~7 as described above, the distribution range of difference value C becomes −7~7.

At step S21, whether or not difference value C is less than 0 is discriminated. In the case where difference value C is less than 0 (YES), processing proceeds to step S22. In the case where difference value C is more than (NO) 0, processing proceeds to step S23 to encode difference value C to complete processing.

At the step S22, after 8 is added to difference value C, processing proceeds to step S23 to encode difference value C to complete processing.

As stated above, 8 which is magnitude of the distribution range of quantization accuracy information is added or subtracted so that the distribution range of difference C becomes 0~7. For this reason, it is sufficient to prepare variable length code books (tables) by the range thereof. Namely, as shown in FIG. 14, size of code book (table) is 8, and this is the same size as that of code book (table) in the case where encoding is carried out without taking difference.

Figure 15:
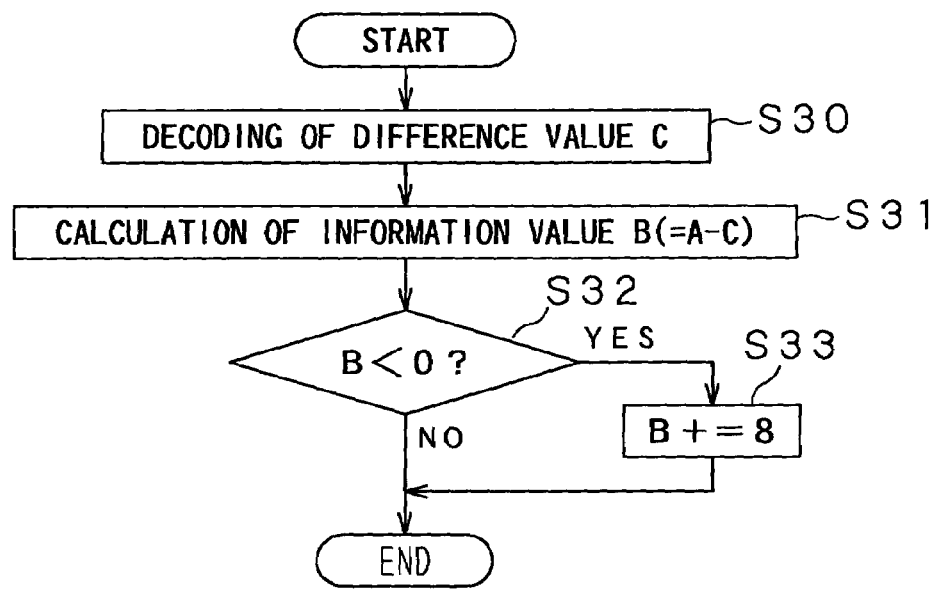
FIG. 15 is a flowchart for explaining another example of decoding processing at the quantization accuracy information decoding unit.

Subsequently, explanation will be given by using the flowchart of FIG. 15 in connection with a decoding technique of decoding quantization accuracy information encoded by this encoding method at the above-described quantization accuracy information decoding unit 32.

First, at step S30, difference value C is decoded from bit stream to determine information value B at the subsequent step S31. At this time, since value of information value A is already known, information value B can be determined by subtracting difference value C from information value A.

Then, at step S32, whether or not information value B is less than 0 is discriminated. In the case where information value B is less than 0 (YES), processing proceeds to step S33 to add 8 to information value B to complete processing. In the case where information value B is more than 0 (NO) at the step S32, processing is completed.

As stated above, as indicated by two examples, such an operation to transform two difference values where difference is 8 into the same value is carried out, thereby making it possible to hold the size of variable length code book (table) down to the same size in the case where encoding is carried out without taking difference.

Meanwhile, while the above-described two examples are adapted so that difference value is determined thereafter to carry out discrimination to carry out addition/subtraction on the basis of the discrimination result, size of variable length code book (table) may be held, without carrying out discrimination, etc., down to the same size in the case where encoding is carried out without taking difference. Explanation will be given below in connection with encoding processing and decoding processing in this technique.

Figure 16:
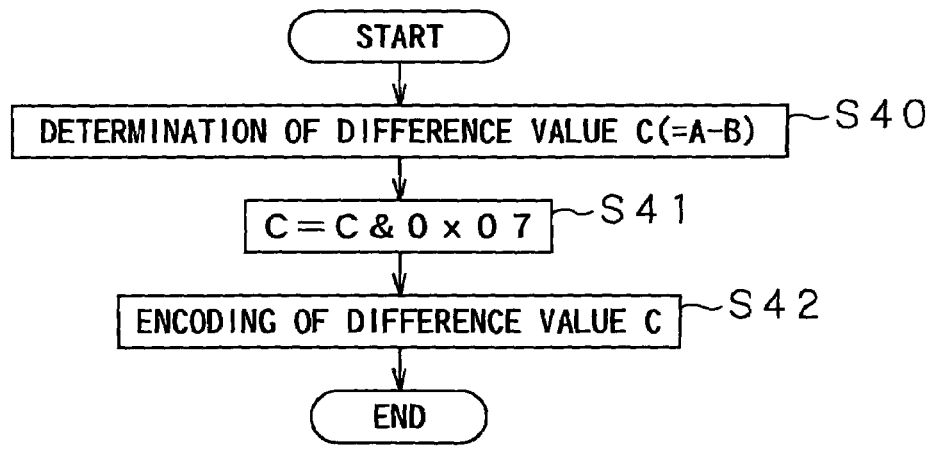
FIG. 16 is a flowchart for explaining processing for transforming difference value without carrying out discrimination, etc. of the magnitude of difference value at the quantization accuracy information encoding unit.

In the encoding processing, as indicated by the flowchart of FIG. 16, first, at step S40, information value B is subtracted from information value A serving as reference value to determine difference value C. Here, as described above, since the distribution range of quantization accuracy information is 0~7, the distribution range of difference value C becomes −7~7.

At step S41, high order one bit of difference value C indicated by 4 bit binary notation is masked to carry out replacement into value consisting of only low order 3 bits. In practical sense, logical product with respect to hexadecimal "0×07", i.e., "0111" of 4 bit binary notation is taken.

Then, at step S42, difference value C replaced into value consisting of only low order 3 bits is encoded to complete processing.

Figure 17:
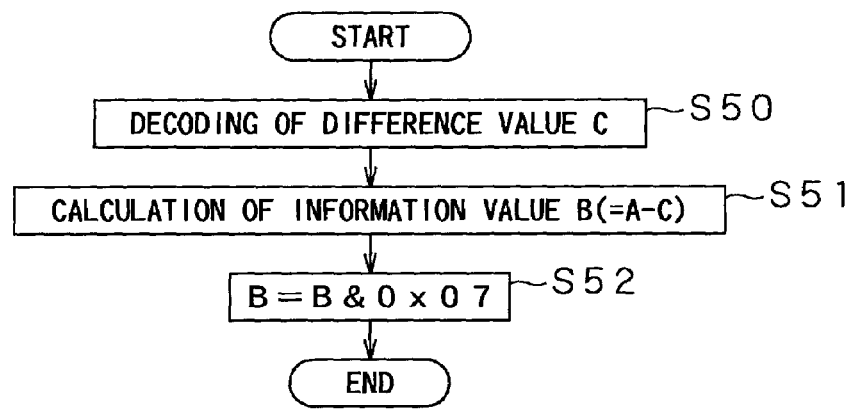
FIG. 17 is a flowchart for explaining decoding processing which does not carry out discrimination, etc. of magnitude of difference value at the quantization accuracy information decoding unit.

Moreover, in the decoding processing, as indicated by the flowchart of FIG. 17, first, at step S50, difference value C is decoded from bit stream to determine information value B at the subsequent step S51. At this time, since value of difference value A is already known, information value B can be determined by subtracting difference value C from information value A.

Then, at step S52, logical product of information value B and hexadecimal "0×07", i.e., "0111" of 4 bit binary notation is taken to complete processing.

As state above, by taking logical product of difference value C and "0111" of 4 bit binary notation, processing equivalent to the processing in which 8 is added in the case where difference value C is negative is deemed to be carried out. In this method, there is no necessity of discriminating magnitude of difference value C. As a result, size of variable length code book (table) can be held with easier down to the same size in the case where encoding is carried out without taking difference.

It is to be noted that while explanation has been given in the above-described explanation on the assumption that difference value C between information value A and information value B is encoded in place of encoding information value B, difference value between difference values may be encoded. Explanation will be given below in connection with encoding processing and decoding processing in this case. It is to be noted that although the number of times in which difference is taken may be arbitrary, explanation will be given below for the brevity only in connection with the case where difference is taken twice. In addition, while explanation will be given in the following example on the assumption that when variable length encoding is carried out, if difference value is more than 3, 8 is subtracted, and if difference value is less than −4, 8 is added, it is a matter of course to employ an approach such that in the case where difference value is negative, 8 is added in a manner as described above.

Figure 18:
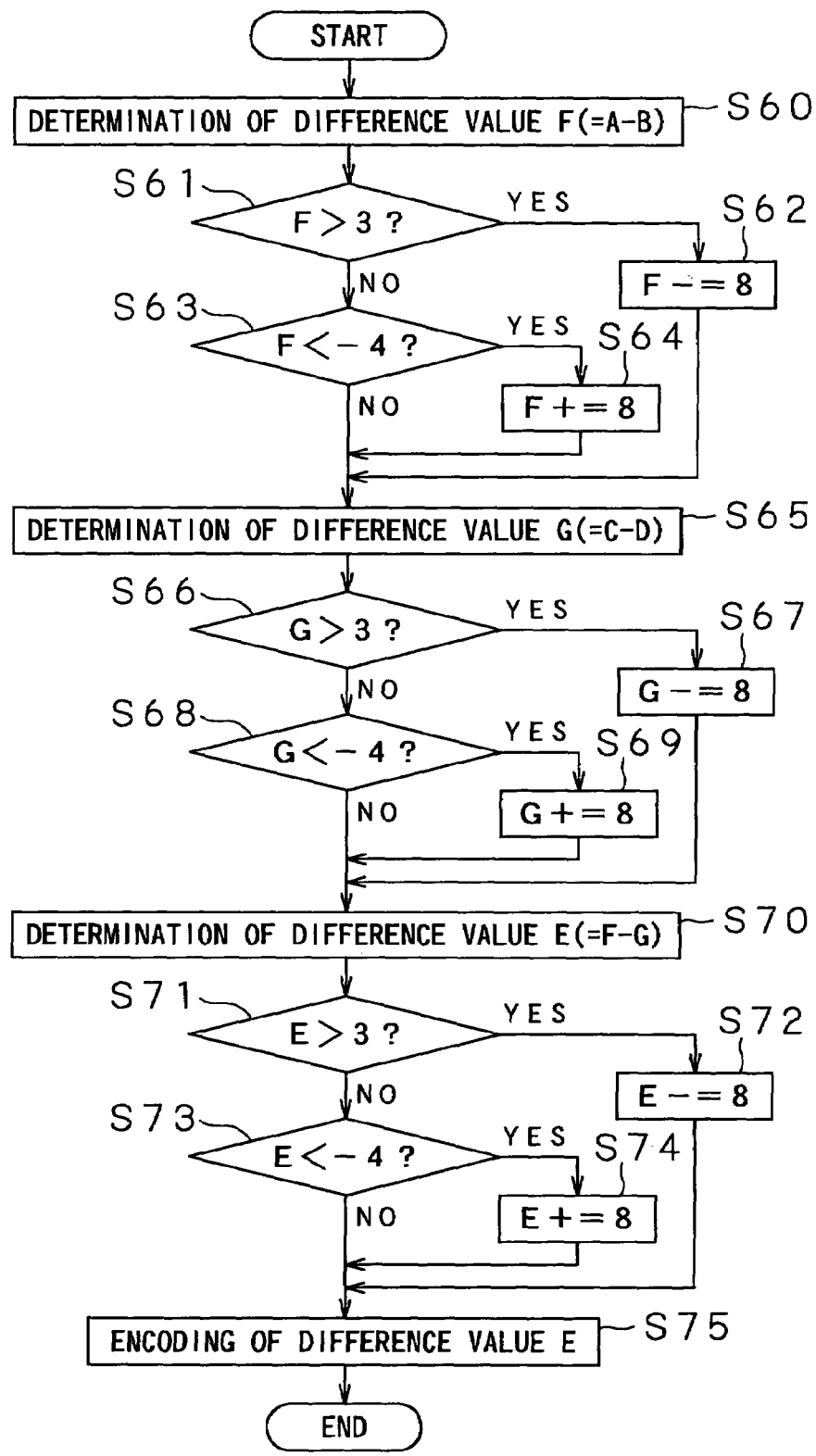
FIG. 18 is a flowchart for explaining processing in transforming difference value of difference value at quantization accuracy information encoding unit of the encoding apparatus.

In the encoding processing, as indicated by the flowchart of FIG. 18, difference value E is encoded. Namely, in place of primarily encoding information value D, difference value E(=(A−B)−(C−D)) is calculated to encode this difference value E. It is to be noted that information values A, B and C are information values serving as reference in calculating difference value, and is a value encoded earlier than information value D.

In practical sense, first, at step S60, difference value F(=A−B) is determined. Here, as described above, since the distribution range of quantization accuracy information is 0~7, the distribution range of difference value F becomes −7~ 7.

Then, at step S61, whether or not difference value is more than 3 is discriminated. In the case where difference value F is more than 3 (YES), 8 is subtracted from difference value F at step S62. Thereafter, processing proceeds to step S65.

In the case where difference value F is less than 3 (NO) at the step S61, processing proceeds to step S63.

At the step S63, whether or not difference value is less than −4 is discriminated. In the case where difference value F is less than −4 (YES), 8 is added to difference value F at step S64. Thereafter, processing proceeds to the step S65. In the case where difference value F is more than −4 (NO) at the step S63, processing proceeds to step S65.

At the step S65, difference value G(=C−D) is determined. Here, as described above, since the distribution range of quantization accuracy information is 0~7, the distribution range of difference value G becomes −7~7.

Then, at step S66, whether or not difference value G is more than 3 is discriminated. In the case where difference value G is 3 or more (YES), 8 is subtracted from difference value G at step S67. Thereafter, processing proceeds to step S70. In the case where difference value G is less than 3 (NO), processing proceeds to step S68.

At the step S68, whether or not difference value G is less than −4 is discriminated. In the case where difference value G is less than −4 (YES), 8 is added to difference value G at step S69. Thereafter, processing proceeds to step S70. In the case where difference value G is more than −4 (NO) at the step S68, processing proceeds the to step S70.

At the step S70, difference value E is determined. Here, since the distribution range of difference value F and difference value G is −4~3, the distribution range of difference value E becomes −7~7.

Then, at step S71, whether or not difference value is more than 3 is discriminated. In the case where difference value E is more than 3 (YES), processing proceeds to step S72. In the case where difference value E is less than 3 (NO), processing proceeds to step S73.

At the step S72, 8 is subtracted from difference value E. Thereafter, processing proceeds to step S75 to encode difference value E to complete processing.

At step S73, whether or not difference value is less than −4 is discriminated. In the case where difference value E is less than −4 (YES), processing proceeds to step S74. In the case where difference value E is more than −4 (NO), processing proceeds to step S75 to encode difference value E to complete processing.

At the step S74, 8 is added to difference value E. Thereafter, processing proceeds to step S75 to encode difference value E to complete processing.

As stated above, 8 which is magnitude of the distribution range of quantization accuracy information is added or subtracted so that the distribution range of difference value E becomes −4~3. For this reason, it is sufficient to prepare variable length code books (tables) by than range. Namely, it is sufficient to prepare code book (table) having the same size as that of code book (table) in the case where encoding is carried out without taking difference.

Figure 19:
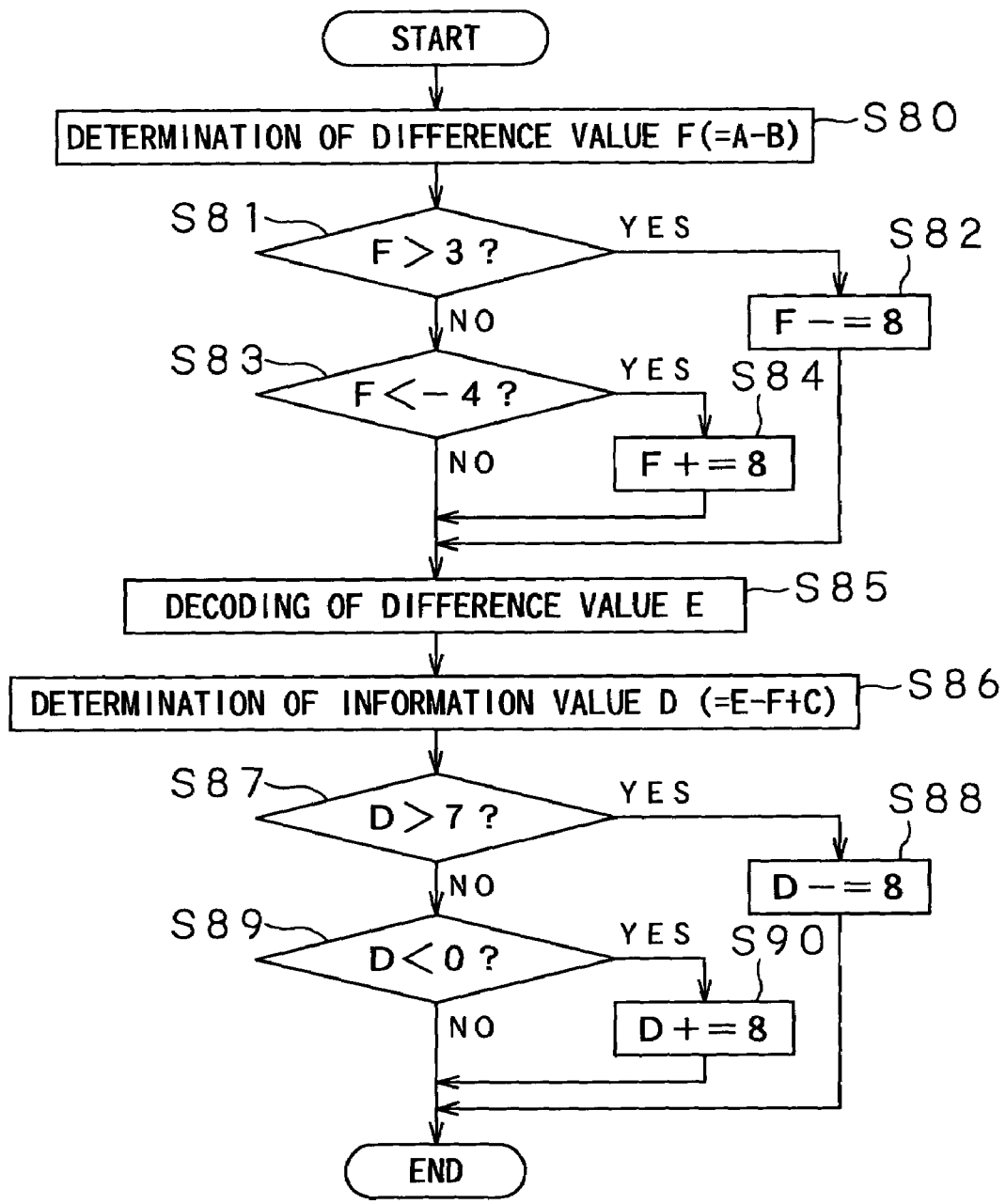
FIG. 19 is a flowchart for explaining processing in decoding difference value of difference value at quantization accuracy information decoding unit of the decoding apparatus.

In the decoding processing, as indicated by the flowchart of FIG. 19, first, at step S80, difference value F(=A−B) is determined. Here, as described above, since the distribution range of quantization accuracy information is 0~7, the distribution range of difference value F becomes −7~7.

Then, at step S81, whether or not difference value F is more than 3 is discriminated. In the case where difference value F is more than 3 (YES), 8 is subtracted from difference value F at step S82. Thereafter, processing proceeds to step S85. In the case where difference value F is less than 3 (NO) at the step S81, processing proceeds to step S83.

At the step S83, whether or not difference value F is less than −4 is discriminated. In the case where difference value F is less than −4 (YES), 8 is added to difference value F at step S84. Thereafter, processing proceeds to step S85. In the case where difference value F is more than −4 at the step S83, processing proceeds to the step S85.

At the step S85, difference value E is decoded. At the subsequent step S86, information value D is determined. This information value D can be determined by subtracting difference value F from difference value E to add information value C to this value.

Then, at step S87, whether or not information value D is more than 7 is discriminated. In the case where information value is more than 7, processing proceeds to step S88 to subtract 8 from information value D to complete processing. In the case where information value D is less than 7 at the step S87, processing proceeds to step S89.

At the step S89, whether or not information value D is less than 0 is discriminated. In the case where information value D is less than 0, processing proceeds to step S90 to add 8 to information value D to complete processing. In the case where information value D is more than 0 at the step S89, processing is completed. By the above-mentioned processing, it is possible to decode information value D.

As explained above, in this embodiment, in encoding difference value of quantization accuracy information and normalization coefficient information, difference value is transformed into value within the restricted range. In general, in quantization accuracy information and/or normalization coefficient information, there are many instances where their values are similar to each other between adjacent normalization units, between adjacent channels or between adjacent times. For this reason, when difference value is calculated, large deviation takes place in that appearance probability. Particularly, probability in the vicinity of difference value "0" becomes very high. Accordingly, short variable length code is given to difference value having high appearance probability, thereby making it possible to decrease the number of bits to be encoded. However, to the contrary, there is the problem that difference is taken so that size of code book (table) is increased. In view of the above, as described above, difference value is transformed into value within the restricted range to thereby prevent increase in code book (table) size so that improvement in encoding efficiency can be realized. In addition, excess bits taking place due to the fact that encoding efficiency has been improved in this way are allocated at encoding of audio signal which is directly subject to encoding so that improvement in quality of encoded sound can be resultantly realized.

It is to be noted that the present invention is not limited only to the above-described embodiments, but it is a matter of course that various changes or modifications can be made within the scope which does not depart from the gist of the present invention.

For example, while explanation has been given in the above-described explanation on the assumption that encoding is carried out by variable length, the present invention is not only limited to such implementation, but encoding may be carried out by fixed length.

Moreover, while explanation has been given in the above-described explanation in connection with the case where the present invention is applied to encoding and decoding of quantization accuracy information and normalization coefficient information, the present invention is not limited to such implementation, but may be applied to any information to be encoded by using difference.

For example, the present invention can be applied to a gain control information as described in the specification and the drawings of the Japanese Patent Application No. 182093/2001 that the inventors of the present application have already proposed. In the encoding apparatus described in the specification and the drawings of the Japanese Patent Application No. 182093/2001, signals every bands divided into plural frequency bands are extracted every block. Whether attack portion where level of waveform signal suddenly becomes larger or release portion where level suddenly becomes small after the attack portion exists at signal within this block is discriminated. In the case where the attack portion or the release portion exists, there are generated a signal of the portion where level is small, which is preceding in point of time with respect to the attack portion, gain control quantity information indicating gain control quantity corresponding to the magnitude of level of the release portion, gain control position information indicating gain control position which is caused to undergo gain control by this gain control quantity, and gain control number indicating the number of gain controlled positions. Thus, gain control processing with respect to waveform signal within block is executed on the basis of the gain control number, the gain control quantity information, and the gain control position information. The gain control number, the gain control quantity information and the gain control position information are encoded and are multiplexed.

Here, there are many instances where the gain control number becomes equal to a value close to adjacent encoding unit. Moreover, there are many instances where the gain control quantity information and the gain control position information become equal to values close to adjacent gain control quantity information and gain control position information within the block. For this reason, differences are respectively taken to carry out variable length encoding of difference values to have ability to improve encoding efficiency.. Further, in this encoding, difference value is transformed into value within restricted range as described above, thereby making it possible to prevent increase in size of code book (table).

Moreover, the present invention can be also applied to parameter for synthesizing waveform as described in the specification and the drawings of the Japanese Patent Application No. 380639/2000 or the Japanese Patent Application No. 182384/2001 that the inventors of the present application have already proposed. In the encoding apparatus described in the specification and the drawings of the Japanese Patent Application No. 380639/2000 or the Japanese Patent Application No. 182384/2001, tone component is extracted from sound (acoustic) series signal to encode frequency, amplitude or phase, etc. of this tone component. In view of the above, in encoding difference value of frequency, amplitude or phase, etc. of this tone component, the present invention can be applied thereto.

Further, in addition to the above, also in encoding difference value of LPC (Linear Predictive Coding) coefficient, LSP (Line Spectrum Pair) coefficient, cepstrum coefficient or pitch information of voice (sound), etc. used as parameter of audio signal, the present invention can be applied thereto.

Further, since waveform information (time series signal) itself also has high correlation with respect to the adjacent time, in encoding difference value, the present invention can be applied thereto.

In addition, also with respect to spectrum coefficients where waveform signal is caused to undergo spectrum transformation, in encoding difference value, the present invention can be applied thereto.

INDUSTRIAL APPLICABILITY

By using the present invention as described above, in encoding a predetermined information value, difference value between the information values is transformed so that the range of value where transformed difference value can take becomes smaller than the range where difference value can primarily take and are then encoded to thereby prevent increase in size of code book (table) in encoding to permit improvement in encoding efficiency.

What is claimed is:

1. An encoding method of encoding a predetermined information value,
   the encoding method including:
   a difference value calculation step of determining difference value between the information values;
   a transformation step of transforming the difference value so that the range of value where transformed difference value can take becomes smaller than the range of value where difference value can primarily take; and
   an encoding step of encoding the transformed difference value.

2. The encoding method as set forth in claim 1,
   wherein when magnitude of the range of value where the information value can take is N, magnitude of the range where transformed difference value at the transformation step can take is caused to be N.

3. The encoding method as set forth in claim 2,
   wherein two difference values where difference therebetween is N is transformed into the same value at the transformation step.

4. The encoding method as set forth in claim 2,
   wherein, at the transformation step, in the case where the difference value is within a predetermined range such that magnitude is N, the difference value itself is caused to be transformed difference value, and in the case where the difference value is not within the predetermined range, value in which N is added or subtracted with respect to the difference value is caused to be the transformed difference value.

5. The encoding method as set forth in claim 1,
   wherein the transformed difference value is caused to be input of the difference value calculation step to further carry out processing of the difference value calculation step and the transformation step.

6. The encoding method as set forth in claim 1,
   wherein the transformed difference value is caused to be input of the difference value calculation step to carry out plural times processing of the difference value calculation step and the transformation step.

7. The encoding method as set forth in claim 1,
   wherein in the case where magnitude N of the range of value where the information value can take is n power of 2,
   only low order n bits of output of the difference value calculation step are taken out at the transformation step, and
   the difference value transformed into n bits is encoded at the encoding step.

8. The encoding method as set forth in claim 1,
   wherein encoding into code train of variable length is carried out at the encoding step.

9. The encoding method as set forth in claim 8,
   wherein the code train of the variable length consists of Huffman code.

10. The encoding method as set forth in claim 1,
    wherein encoding into code train of fixed length is carried out at the encoding step.

11. The encoding method as set forth in claim 1,
    wherein the information value includes at least one of normalization coefficient information, quantization accuracy information, gain control information, spectrum coefficient information and sound time series signal.

12. An encoding apparatus adapted for encoding a predetermined value,
    the encoding apparatus comprising:
    difference value calculating means for determining difference value between the information values;
    transforming means for transforming the difference value so that the range of value where transformed difference value can take becomes smaller than the range of value where difference value can primarily take; and
    encoding means for encoding the transformed difference value.

13. The encoding apparatus as set forth in claim 12,
    wherein when magnitude of the range where the information value can take is N, magnitude of the range where difference value transformed by the transforming means can take is caused to be N.

14. The encoding apparatus as set forth in claim 13,
    wherein the transforming means transforms two difference values where difference is N into the same value.

15. A decoding method of inputting transformed difference value encoded by an encoding method of determining difference value of a predetermined information value to transform the difference value so that the range of value where transformed difference value can take becomes smaller than the range of value where difference can primarily take to encode the transformed difference value to decode the information value,
    the decoding method including:
    a difference value decoding step of decoding the transformed difference value; and
    an information value restoring step of determining primary information value by using the transformed difference value decoded at the difference value decoding step.

16. The decoding method as set forth in claim 15,
    wherein when magnitude of the range of value where difference value decoded at the difference value decoding step can primarily take is N, magnitude of the range where information value restored at the information value decoding step can take is N.

17. The decoding method as set forth in claim 16,
    wherein, with respect to one difference value decoded at the difference value decoding step, at the information value restoring step, either one of two information values such that difference therebetween is N is restored as information value.

18. The decoding method as set forth in claim 15,
    wherein, at the information value restoring step, in the case where the information value is within a predetermined range such that magnitude is N, the information value itself is caused to be restored difference value, and in the case where the information value is not within the predetermined range, value in which N is added or subtracted with respect to the information value is caused to be the restored information value.

19. The decoding method as set forth in claim 15,
    wherein value restored at the information value restoring step is inputted for a second time at the difference value decoding step to further carry out processing of the difference value decoding step and of the information value restoring step.

20. The decoding method as set forth in claim 15, wherein value restored at the information value restoring step is inputted for a second time at the difference value decoding step to carry out plural times processing of the difference value decoding step and the information value restoring step.

21. The decoding method as set forth in claim 15, wherein in the case where magnitude N of the range where the information value can take is n power of 2, the difference value is transformed so that there results n bits and encoded difference value is inputted, the difference value of n bits is decoded at the difference value decoding step, and only low order n bits of information value calculated by using the difference value after undergone decoding are taken out at the information value restoring step so that primary information value is determined.

22. The decoding method as set forth in claim 15, wherein the information value includes at least one of normalization coefficient information, quantization accuracy information, gain control information, spectrum coefficient information and acoustic time series signal.

23. (Original) A decoding apparatus adapted for inputting transformed difference value encoded by an encoding method of determining difference value of a predetermined information value to transform the difference value so that the range of value where transformed difference value can take becomes smaller than the range of value where difference value can primarily take to encode the transformed difference value to decode the information value, the decoding apparatus comprising:

difference value decoding means for decoding the transformed difference value; and information value restoring means for determining primary information value by using the transformed difference value decoded by the difference value decoding means.

24. The decoding apparatus as set forth in claim 23, wherein when magnitude of the range of value where difference value decoded by the difference value decoding means can primarily take is N, magnitude of the range where information value restored by the information value restoring means can take is N.

25. The decoding apparatus as set forth in claim 24, wherein, with respect to one difference value decoded by the difference value decoding means, the information value restoring means restores, as information value, either of two difference values such that difference therebetween is N.

26. A transmission method of encoding a predetermined information value to carry out transmission thereof, the transmission method including:

a difference value calculation step of determining difference value between the information values;

a transformation step of transforming the difference value so that the range of value where transformed difference value can take becomes smaller than the range of value where difference value primarily can take;

an encoding step of encoding the transformed difference value; and a transmission step of carrying out transmission of the encoded transformed difference value.

27. The transmission method as set forth in claim 26, wherein when magnitude of the range where the information value can take is N, magnitude of the range where transformed difference value at the transformation step can take is caused to be N.

28. The transmission method as set forth in claim 27, wherein, at the transformation step, two difference values where difference therebetween is N is transformed into the same value.

29. A transmission apparatus adapted for encoding a predetermined information value to carry out transmission thereof, the transmission apparatus including:

difference value calculating means for determining difference value between the information values;

transforming means for transforming the difference value so that the range where transformed difference value can take becomes smaller than the range where difference value can primarily take;

encoding means for encoding the transformed difference value; and transmission means for carrying out transmission of the encoded transformed difference value.

30. The transmission apparatus as set forth in claim 29, wherein when magnitude of the range where the information value can take is N, magnitude of the range of value where difference value transformed by the transforming means can take is caused to be N.

31. The transmission apparatus as set forth in claim 30, wherein the transforming means transforms two difference values where difference therebetween is N into the same value.

32. A recording medium adapted so that there is recorded transformed difference value encoded by an encoding method including a difference value calculation step of determining difference value between predetermined information values, a transformation step of transforming the difference value so that the range where transformed difference value can take becomes smaller than the range of value where difference value can primarily take, and an encoding step of encoding the transformed difference value.

33. The recording medium as set forth in claim 32, wherein when magnitude of the range of value where the information value can take is N, magnitude of the range of value where transformed difference value at the transformation step is caused to be N.

34. The recording medium as set forth in claim 33, wherein, in the encoding method, at the transformation step, two difference values where difference therebetween is N is transformed into the same value.

* * * * *